(12) United States Patent
Takenaka et al.

(10) Patent No.: US 7,102,260 B2
(45) Date of Patent: Sep. 5, 2006

(54) DRIVE DEVICE

(75) Inventors: Masayuki Takenaka, Aichi-ken (JP);
Naruhiko Kutsuna, Aichi-ken (JP);
Kozo Yamaguchi, Aichi-ken (JP)

(73) Assignee: Aisin Aw Co., Ltd., Aichi-ken (JP)

( * ) Notice: Subject to any disclaimer, the term of this patent is extended or adjusted under 35 U.S.C. 154(b) by 0 days.

(21) Appl. No.: 10/500,581

(22) PCT Filed: May 8, 2003

(86) PCT No.: PCT/JP03/05748

§ 371 (c)(1),
(2), (4) Date: Nov. 5, 2004

(87) PCT Pub. No.: WO2004/025808

PCT Pub. Date: Mar. 25, 2004

(65) Prior Publication Data

US 2005/0168081 A1 Aug. 4, 2005

(30) Foreign Application Priority Data

Sep. 13, 2002 (JP) ............................. 2002-269230

(51) Int. Cl.
*H02K 1/32* (2006.01)
(52) U.S. Cl. .......................................... 310/64; 310/52
(58) Field of Classification Search ................. 310/52, 310/54, 58, 64
See application file for complete search history.

(56) References Cited

U.S. PATENT DOCUMENTS

| 5,491,370 | A |   | 2/1996 | Schneider et al. |
| 5,585,681 | A |   | 12/1996 | Bitsche |
| 6,002,183 | A | * | 12/1999 | Iversen et al. ............... 307/147 |
| 6,039,114 | A |   | 3/2000 | Becker et al. |
| 6,198,183 | B1 |   | 3/2001 | Baemel et al. |
| 6,201,365 | B1 | * | 3/2001 | Hara et al. ................... 318/558 |
| 6,323,613 | B1 | * | 11/2001 | Hara et al. ................... 318/471 |
| 6,664,673 | B1 | * | 12/2003 | Lopatinsky et al. .......... 310/63 |
| 6,833,641 | B1 | * | 12/2004 | Uchida et al. ................. 310/54 |
| 2001/0014029 | A1 |   | 8/2001 | Suzuki et al. |

FOREIGN PATENT DOCUMENTS

| EP | 1 137 154 A1 | 9/2001 |
| JP | 05-283878 A | 10/1993 |
| JP | 07-288949 A | 10/1995 |
| JP | 07-298552 A | 11/1995 |
| JP | 8-65944 A | 3/1996 |
| JP | 09-182352 A | 7/1997 |

(Continued)

*Primary Examiner*—Darren Schuberg
*Assistant Examiner*—Nguyen N. Hanh
(74) *Attorney, Agent, or Firm*—Sughrue Mion, PLLC

(57) ABSTRACT

A drive unit comprises an electric motor 1, a drive unit casing 2 accommodating therein the electric motor, an inverter 3 that controls the electric motor, and a flow passage of a refrigerant that cools the inverter. The inverter is mounted on a heat sink 53 and mounted to the drive unit casing with a space R defined, and the space is communicated to the flow passage of the refrigerant. The heat sink comprises fins 56, and the drive unit casing comprises fins 22, the both fins being apart from each other. Thereby, both a side of the drive unit casing and a side of the heat sink are effectively cooled by heat exchange with a cooling refrigerant in wide areas. Also, the fins are apart from each other whereby direct heat conduction is avoided and efficient cooling is enabled with temperature gradient conformed to heat-resistant temperatures.

13 Claims, 9 Drawing Sheets

FOREIGN PATENT DOCUMENTS

| | | |
|---|---|---|
| JP | 2001-119898 A | 4/2001 |
| JP | 2001-238405 A | 8/2001 |
| JP | 2001-238406 A | 8/2001 |
| JP | 2002-185175 A | 6/2002 |
| WO | WO 98/28833 A2 | 7/1998 |

* cited by examiner

DRIVE DEVICE

TECHNICAL FIELD

The present invention relates to a drive unit that uses an electric motor as a power source, and, more particular, to a cooling technique in drive units for electric cars and drive units for hybrid cars.

BACKGROUND ART

In the case where an electric motor is used as a power source for vehicles, the electric motor needs a control device (an inverter in the case of an AC electric motor) for control thereof. Since the control device such as inverters, etc. is connected to the electric motor by way of power cable, it can be arranged in an appropriate position apart from the electric motor. For the convenience for a car-mounted arrangement, there is in some cases adopted an arrangement, in which the control device is united with the electric motor.

By the way, control devices in current technology are lower in heat-resistant temperature than electric motors. Hereupon, in the case where a control device is to unite with an electric motor in the above-mentioned manner, certain means that cuts off direct heat conduction from the electric motor to the control device is needed in order to protect the control device. Also, since the control device is raised in temperature due to heat generation by its elements, cooling is necessary in order to maintain the control device at the heat-resistant temperature thereof or lower.

Under such situation, the pamphlet of International Publication No. 98/28833 conventionally proposes an electric motor united with a control device, in which a groove is formed on an outer periphery of a stator body of the electric motor and a bottom plate mounting thereon a module of the control device closes an opening side of the groove to provide a cooling path. In this technique, a cooling flange is formed to extend into the groove on a side of the bottom plate.

Also, a similar technique to the above one is described in U.S. Pat. No. 5,491,370. The technique adopts a construction, in which a spiral passage for flowing of a cooling fluid is formed on an outer periphery of a housing of an electric motor and an IGBT module (inverter component) is mounted to a sleeve that is externally mounted on the housing in a manner to cover an opening surface side of the passage.

Hereupon, with the conventional construction of the former technique, since formation of the cooling flange leads to enlargement of a heat exchange area on a side of the bottom plate that mounts thereto the module, cooling on a side of the module is expedited but cooling on a side of the stator body is not necessarily adequate since a heat exchange area is defined by an area of the groove bottom surface. Accordingly, with such construction, for the purpose of preventing heat on the side of the stator body from being transferred to the module side via the cooling flange, it is required that a tip end of the cooling flange be made apart to some extent from the groove bottom surface of the stator body and the heat insulation effect by a cooling fluid be ensured by a gap therebetween. And, in the case where such gap is made large, the effect of the cooling flange as a flow passage guide is decreased.

On the other hand, with the latter technique, since it is difficult to ensure a sufficient area, in which the sleeve contacts with the cooling fluid, there is a need of increasing the flow rate of a cooling fluid flowing through the spiral path in order to adequately cool inverter components, in which case a pump, etc. for circulation of the cooling fluid becomes large in size and so energy for driving thereof is increased. Also, with the technique, since a tip end of the wall that defines the spiral path is brought in direct contact with the sleeve, heat conduction is caused at such contact region, so that in order to maintain the inverter components at the heat-resistant temperature thereof or lower, there is a need of cooling that lowers temperature of the housing of the electric motor substantially to such temperature, which is not efficient in terms of cooling efficiency.

The invention has been thought of taking account of such conventional techniques, and has its main object to ensure a maximum heat radiation area for a refrigerant within a limited cooling space in a drive unit, in which an inverter is united with an electric motor, while restricting heat conduction from the electric motor to the inverter. Subsequently, it is a further object of the invention to expedite flow of a refrigerant by means of heat radiation means within the cooling space to enhance the cooling capacity.

DISCLOSURE OF THE INVENTION

In order to attain the above objects, the invention has a feature in a drive unit including an electric motor, a drive unit casing accommodating therein the electric motor, an inverter that controls the electric motor, and a flow passage of a refrigerant that cools the inverter, the drive unit characterized in that the inverter is mounted on the drive unit casing such that a heat sink united with a substrate of the inverter defines a space on a portion thereof opposed to the drive unit casing, the space is communicated to the flow passage of the refrigerant, the heat sink comprises heat-sink side fins extending into the space toward the drive unit casing, the drive unit casing comprises drive-unit-casing side fins extending into the space toward the heat sink, and the heat-sink side fins and the drive-unit-casing side fins are apart from each other.

With the construction, adequate heat conductive areas are ensured on the drive-unit-casing side and the heat-sink side, so that the both sides, respectively, can be effectively cooled by expedited cooling that is caused by heat exchange with a cooling refrigerant in such large areas. Also, since the heat-sink side fins and the drive-unit-casing side fins are apart from each other and so direct heat conduction from the drive unit casing to the heat sink is avoided, it is not required that temperature on the drive-unit-casing side be lowered to the heat-resistant temperature of the control device that is needed on the heat-sink side, and efficient cooling with temperature gradient kept therebetween can be performed. Thereby, a small flow rate of the refrigerant can efficiently prevent temperature rise of the inverter caused by unification of the electric motor and the inverter.

It is desired in the above construction that the heat-sink side fins and the drive-unit-casing side fins cooperatively generate a common refrigerant flow pattern within the space. Also, with the construction, the fins are used to generate a common refrigerant flow on both the heat-sink side and the drive-unit-casing side within the space, so that it is possible to prevent stagnation due to interference of the refrigerant flow from being generated in the space.

In this case, the heat-sink side fins and the drive-unit-casing side fins may comprise the same fins or different fins. In particular, with the construction, in which the both fins comprise the same fins, only by arranging the heat-sink side fins and the drive-unit-casing side fins in the same manner, it is possible to generate a predetermined flow pattern free from stagnation due to interference of flow in the space.

And, in the case where the both fins comprise the same fins, both the heat-sink side fins and the drive-unit-casing side fins can comprise pin-shaped fins. With such construction, the flow passage resistance can be sharply reduced as compared with the construction, in which the rib-shaped fins guide the fluid flow within the space. Accordingly, this construction makes it possible to reduce pressure loss in the flow passage whereby the inverter united with the drive unit can be cooled with less energy consumption.

Also, in the case where the both fins comprise different fins, one of them can comprise rib-shaped fins and the other of them can comprise pin-shaped fins. With such construction, as compared with the construction, in which both the heat-sink side fins and the drive-unit-casing side fins comprise rib-shaped fins, the flow passage resistance in the entire space can be reduced corresponding to an extent, to which the flow passage resistance is reduced on a side of the pin-shaped fins.

Also, it is desired in the above construction that the heat-sink side fins and the drive-unit-casing side fins cooperatively and substantially cross the space with a minute gap therebetween. With such construction, it is possible to generate a substantially single flow of the cooling fluid free from stagnation due to interference of flow in the space while avoiding heat conduction due to direct contact between the heat-sink side fins and the drive-unit-casing side fins.

BEST MODE FOR CARRYING OUT THE INVENTION

Figure 1:
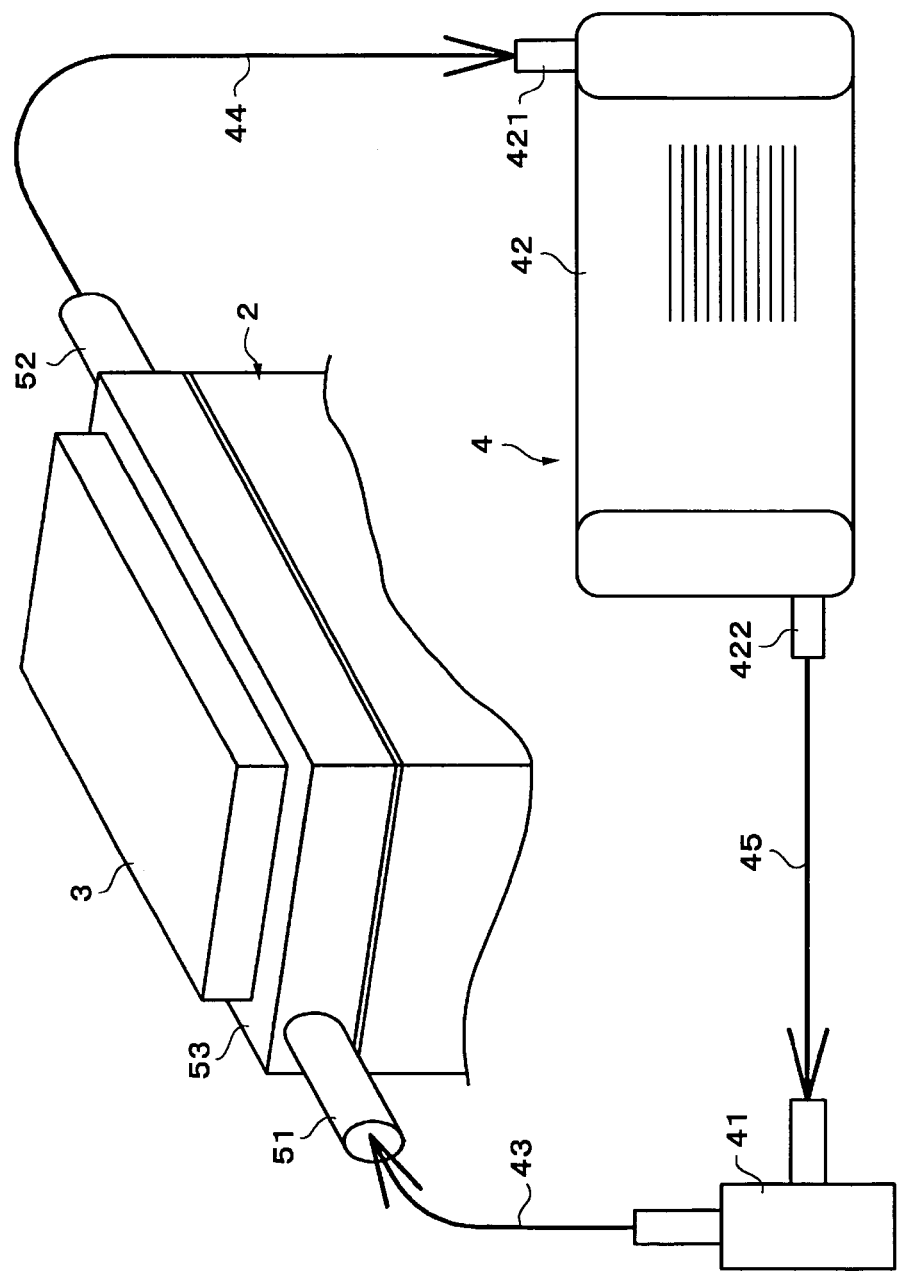
FIG. 1 is a view showing a configuration of a cooling system of a drive unit according to the invention.

Embodiments of the invention will be described below with reference to the drawings. First, FIG. 1 schematically and conceptionally shows a cooling system of a drive unit, to which the invention is applied. The drive unit comprises an electric motor, of which illustration is omitted, a drive unit casing 2 that accommodates therein the electric motor, an inverter 3 that controls the electric motor, and a flow passage 4 of a refrigerant that cools the inverter 3. An inverter referred to in the specification of the present application means a power module composed of a switching transistor and associated circuit elements that convert DC of a battery power source into AC (three-phase AC in the case where the electric motor is a three-phase AC electric motor) under the switching action, and a circuit board arranging thereon the switching transistor and the associated circuit elements. The drive unit in this embodiment constitutes one for electric cars or hybrid cars, and the drive unit casing 2 accommodates therein a motor or a generator or the both thereof as an electric motor (not shown), a differential device, and an accessory mechanism such as counter gear mechanism, etc. A substrate itself of the inverter 3, or a heat sink 53 made integral with the substrate by attaching a separate member to the substrate is mounted to the drive unit casing 2 while a space is defined in a region opposed to the drive unit casing 2, and the space is communicated to the refrigerant flow passage 4. In this embodiment, the refrigerant flow passage 4 makes a refrigerant circulation path, in which a single refrigerant passes through the flow passage of the heat sink 53 to be circulated.

The refrigerant circulation path, in which a cooling water as a single refrigerant passes through the heat sink 53 to be circulated, comprises a water pump 41 as a pressure feed source, a radiator 42 as a heat exchanger, and flow passages 43, 44, 45 connecting these pump and radiator together. In addition, illustration of an accessory equipment such as a drive motor of the water pump 41, etc. is omitted. The discharge-side flow passage 43 of the water pump 41 as a starting point of the refrigerant circulation path is connected to a port 51 on an inlet side of the heat sink 53, a port 52 on an outlet side of the heat sink 53 is connected to an inlet 421 side of the radiator 42 via the return flow passage 44, and an outlet 422 side of the radiator 42 is connected to the suction-side flow passage 45 of the water pump 41. Accordingly, a cooling water as a refrigerant in the refrigerant circulation path is fed from the water pump 41, then absorbs heat from a module of the inverter 3 to be heated when flowing through the space in the heat sink 53, is fed into the radiator 42 via the return flow passage 44 to be cooled due to radiation of heat to an air, is returned to the water pump 41, terminates a round of cycles, and repeats this circulation. In addition, the refrigerant circulation path can also be made a flow passage in that portion midway, for example, the return flow passage 44, to extend through the drive unit casing 2 for further cooling.

Figure 2:
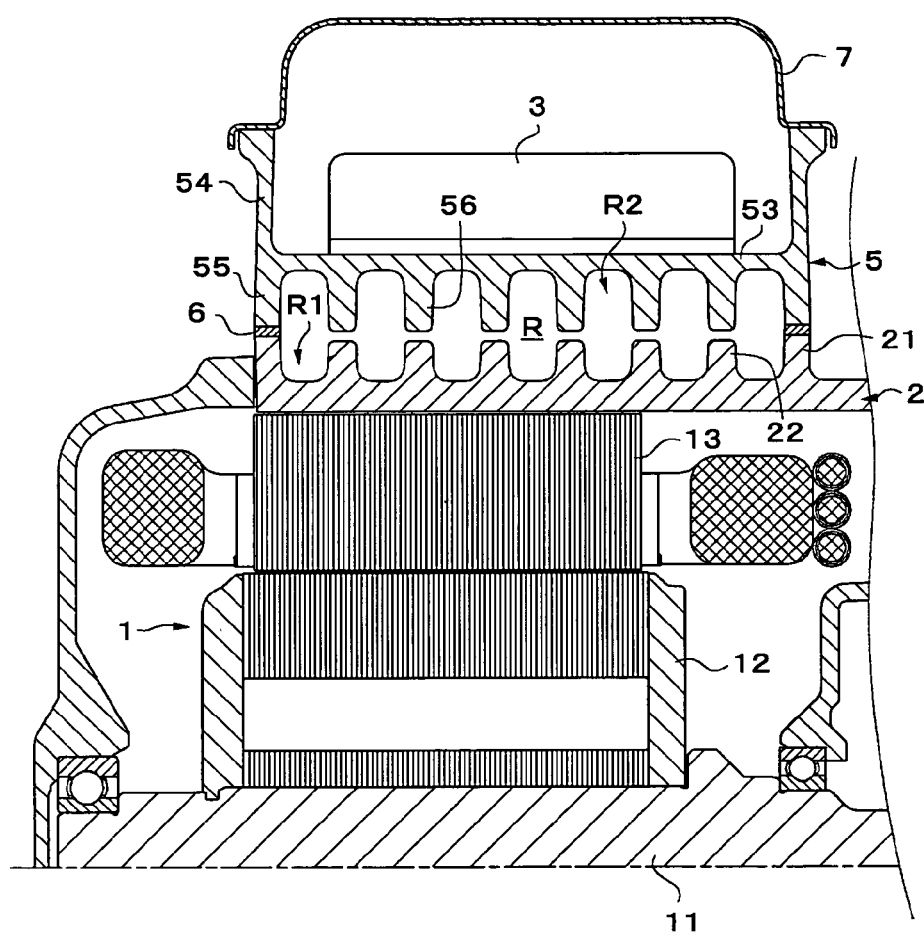
FIG. 2 shows a longitudinal, cross section of the drive unit in an axial direction.
Figure 3:
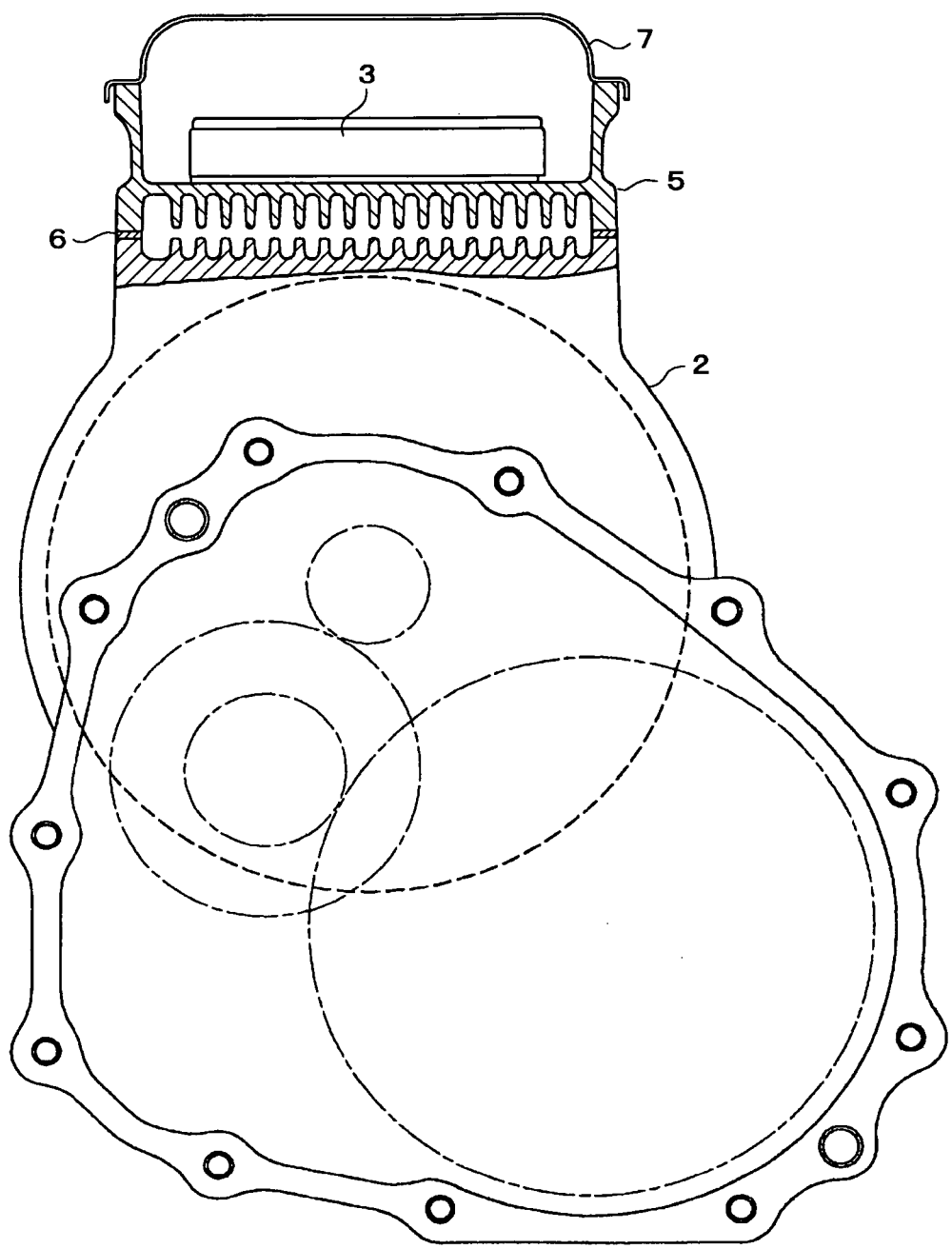
FIG. 3 shows a longitudinal, cross section of the drive unit in a transverse direction to the axial direction.

Subsequently, FIGS. 2 and 3 show, in a simplified manner, a longitudinal, cross section of the drive unit in an axial direction, and a longitudinal, cross section of the drive unit in a transverse direction to the axial direction. In FIG. 2, the reference numeral 1 denotes an electric motor, 11 a rotor shaft, 12 a rotor core, and 13 a stator core, and in FIG. 3, a circle shown by a broken line indicates an outside diameter of the electric motor 1, a circle shown by an alternate long and short dash line and having a maximum diameter indicates an intermeshing pitch diameter of a ring gear of the differential device, and respective circles shown by alternate long and short dash lines and having medium diameters indicate intermeshing pitch diameters of respective gears of the counter gear mechanism that transmits power between the rotor shaft 11 and the ring gears of the differential device.

A mount of an inverter casing 5 united with the heat sink 53 as a bottom wall is formed integral with an upper portion of the drive unit casing 2. The mount of the inverter casing 5 is arranged in a manner to contact with an outer periphery of an electric motor receiving section, is in the form of a base, a plane outline of which substantially corresponds to that of the inverter casing 5, and comprises a space R1 defined by a peripheral wall 21 that surrounds the outline in a frame-like manner. The space R1 constitutes a space section, on a drive unit casing 2 side of a space R defined in a region, in which the heat sink 53 is opposed to the drive unit casing 2.

In the embodiment, the heat sink 53 comprises a member separate from the substrate of the inverter 3, and is constituted by a bottom wall 53 of the inverter casing 5, and the inverter casing 5 is in the form of a casing provided with a peripheral wall 54 that extends upward from the bottom wall 53 in a manner to surround the outline in a frame-like manner, and has an interior thereof serving as a space that accommodates therein the inverter 3. And, the module constituting the inverter 3 is tightly fixed by appropriate means to the bottom wall 53 of the inverter casing 5 that is finished flat so as to make the module close thereto and integral therewith. And, an upper opening of the inverter casing 5 is closed by a cover 7. Provided below the bottom wall 53 of the inverter casing 5 is a space R2 defined by a peripheral wall 55 that extends downward in a manner to surround the outline thereof. The space R2 constitutes a heat sink 53 side space of the space R defined in the region, in which the heat sink 53 is opposed to the drive unit casing 2.

The inverter casing 5 constructed in this manner is caused to abut against a mount surface of the drive unit casing 2, and fixed integrally thereto by means of appropriate fixation means such as bolting, etc. While such abutting portions may be arranged in direct contact with each other, an appropriate intermediate member 6 having the function of sealing, or the function of thermal insulation, or the both functions in an illustrated example is interposed between mating surfaces of the inverter casing 5 and the drive unit casing 2 so as to prevent heat conduction at the mount section. While the intermediate member 6 is desirably interposed between the mating surfaces in the case where it is made of a thermal insulating material or a thermal sealing material, a sealing material can be arranged in grooves formed on the mating surfaces in the case where the intermediate member is made of a separate thermal insulating material and the sealing material.

According to a feature of the invention, the heat sink 53 comprises a multiplicity of heat-sink side fins 56 extending into the space toward the drive unit casing 2, and the drive unit casing 2 comprises a multiplicity of drive-unit-casing side fins 22 extending into the space toward the heat sink 53, the heat-sink side fins 56 and the drive-unit-casing side fins 22 being apart from each other so as to prevent contact at their tip ends. In addition, for the purpose of avoiding complexity in the drawings, the number of these fins 56, 22 is shown in all the drawings as being less than the number of fins actually arranged. The construction, in which the both fins are apart from each other, can be realized either by providing gaps between fin tip ends arranged in the same position, or by arranging the fins in different positions. In the case where either of the measures is adopted, the heat-sink side fins 56 and the drive-unit-casing side fins 22 cooperatively generate a common refrigerant flow pattern in the space.

Figure 4:
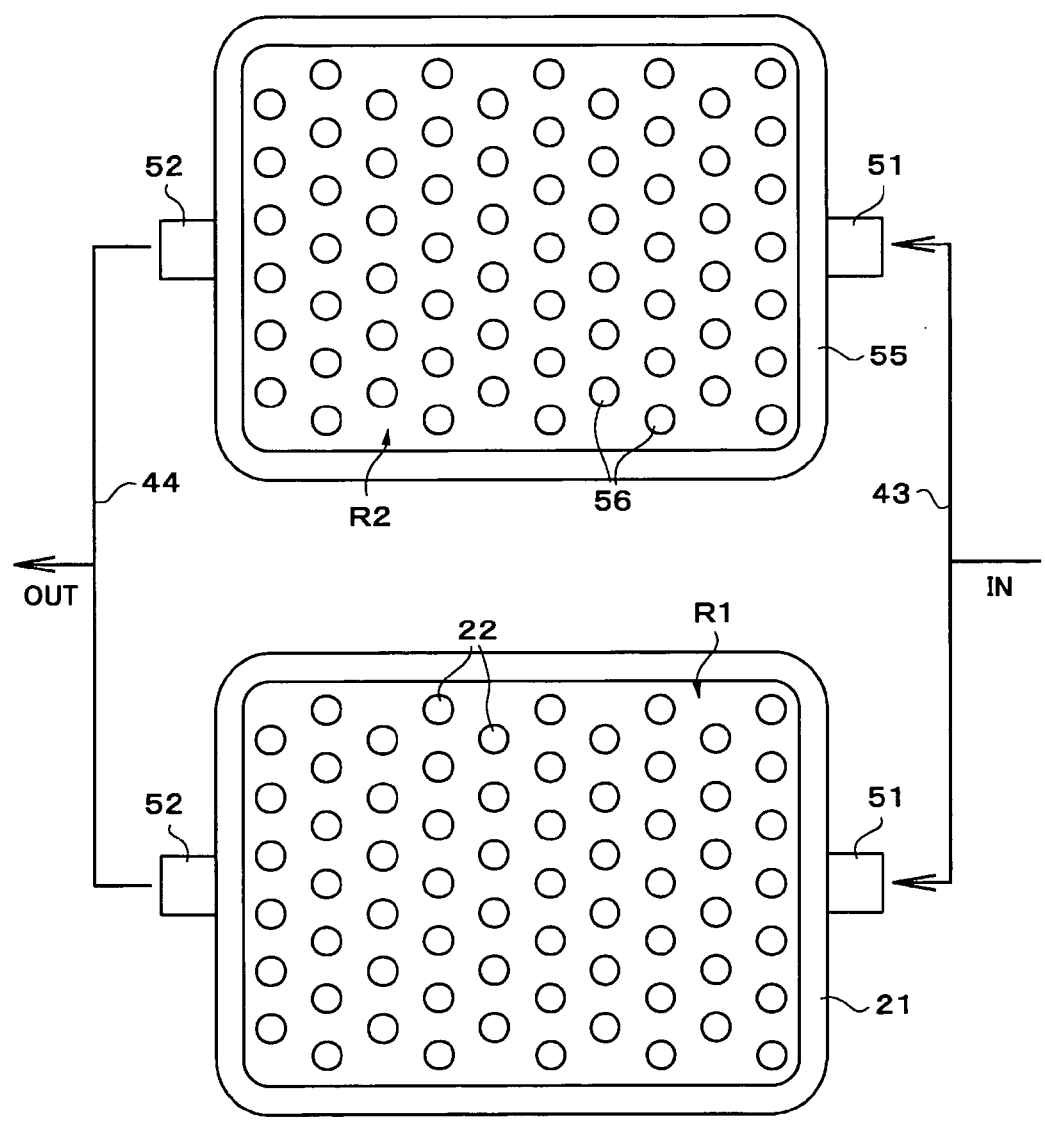
FIG. 4 is a schematic plan view showing a fin arrangement according to a first embodiment, in which facing surfaces of a heat sink and a drive unit casing are aligned in the same plane.

Next, FIG. 4 shows a pattern according to a first embodiment, in which the heat-sink side fins 56 and the drive-unit-casing side fins 22 are arranged, in a schematic plan that illustrates a bottom surface of the inverter casing 5 and a mount surface on the side of the drive unit casing 2, the both surfaces being actually in the opposed relationship with each other, in a state, in which the both surfaces are aligned in the same plane. In this embodiment, both the heat-sink side fins 56 and the drive-unit-casing side fins 22 comprise pin-shaped fins that are arranged at equal intervals in the same pattern. In the case of this embodiment, since the both fins coincide with each other in those positions in the space R, in which they are arranged, the heat-sink side fins 56 and the drive-unit-casing side fins 22 are apart from each other with minute gaps therebetween, but they are arranged in the same number so as to cooperatively and substantially cross the space R.

In the case of the fin arrangement pattern according to the first embodiment, it is possible to generate a substantially single cooling fluid pattern free from stagnation in the space due to interference of flow while avoiding heat conduction due to direct contact between the heat-sink side fins 56 and the drive-unit-casing side fins 22, in other words, making use of a fluid flowing through the gaps between the both fins as a heat insulating layer. Also, as compared with a construction, in which a fluid flow in the space is guided by rib-shaped fins, it is possible to sharply reduce the flow passage resistance. Accordingly, with this construction, pressure loss in the flow passage can be reduced, whereby the inverter 3 united with the drive unit and together with the drive unit casing 2 can be cooled with less energy consumption.

Figure 5:
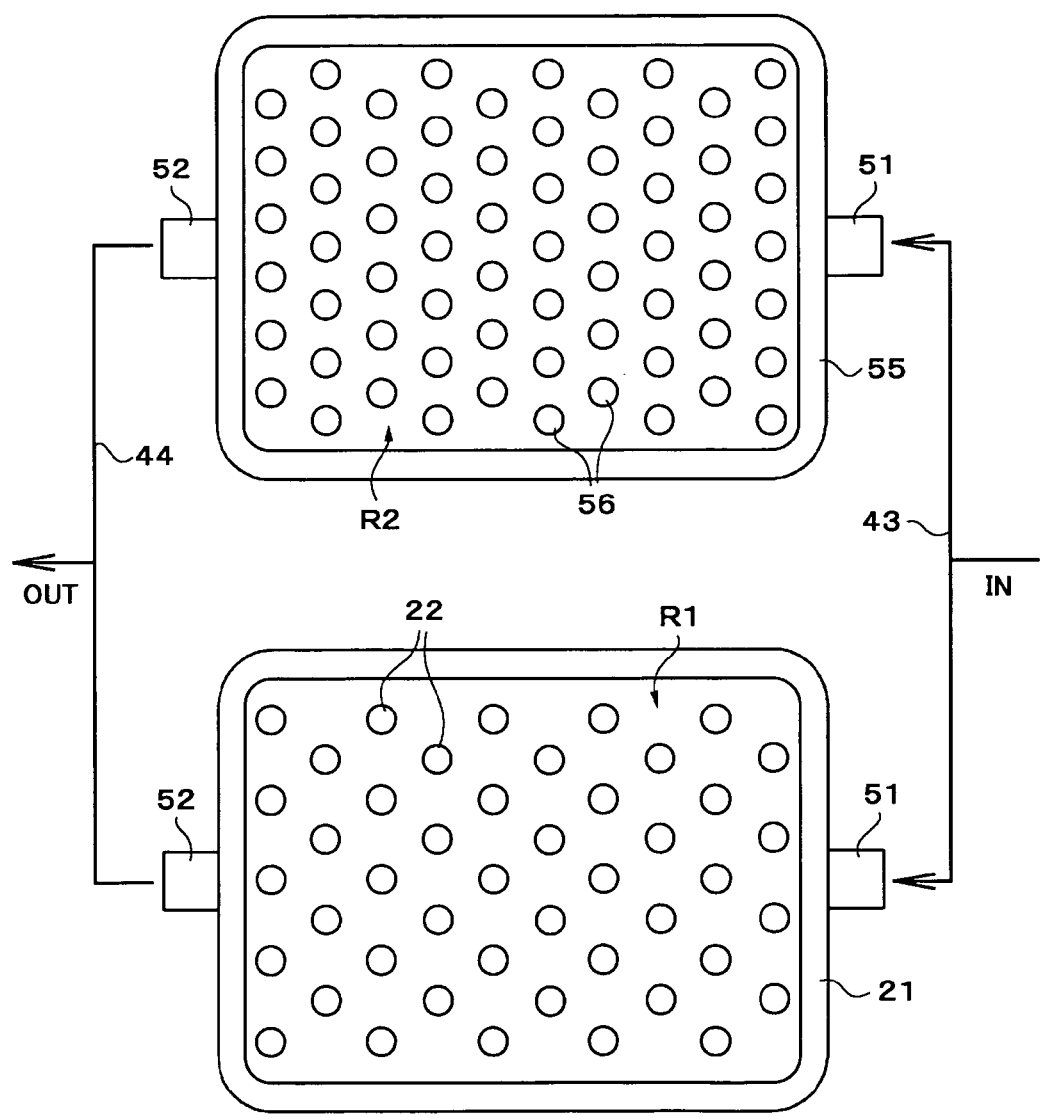
FIG. 5 is a schematic plan view showing a fin arrangement according to a second embodiment in the same representation as in FIG. 4.

Next, according to a second embodiment shown in FIG. 5, both heat-sink side fins 56 and drive-unit-casing side fins 22 comprise pin-shaped fins and the both fins are arranged at equal intervals in a plane within the space. In the embodiment, the drive-unit-casing side fins 22 are less in number than the heat-sink side fins 56 and more sparsely arranged in density than the latter fins are. In this arrangement, since the heat-sink side fins 56 have a large heat-exchanging area, cooling is intensely performed on the side of the heat sink 53, so that a difference in cooling capacity can generate, in the space, temperature gradient conformed to respective heat-resistant temperatures of the inverter 3 and the electric motor 1. Besides, as compared with the first embodiment, pressure loss in the entire space R can be reduced corresponding to an extent, to which the drive-unit-casing side fins 22 are arranged to be sparse in density, and so further reduction in energy consumption can be achieved.

Figure 6:
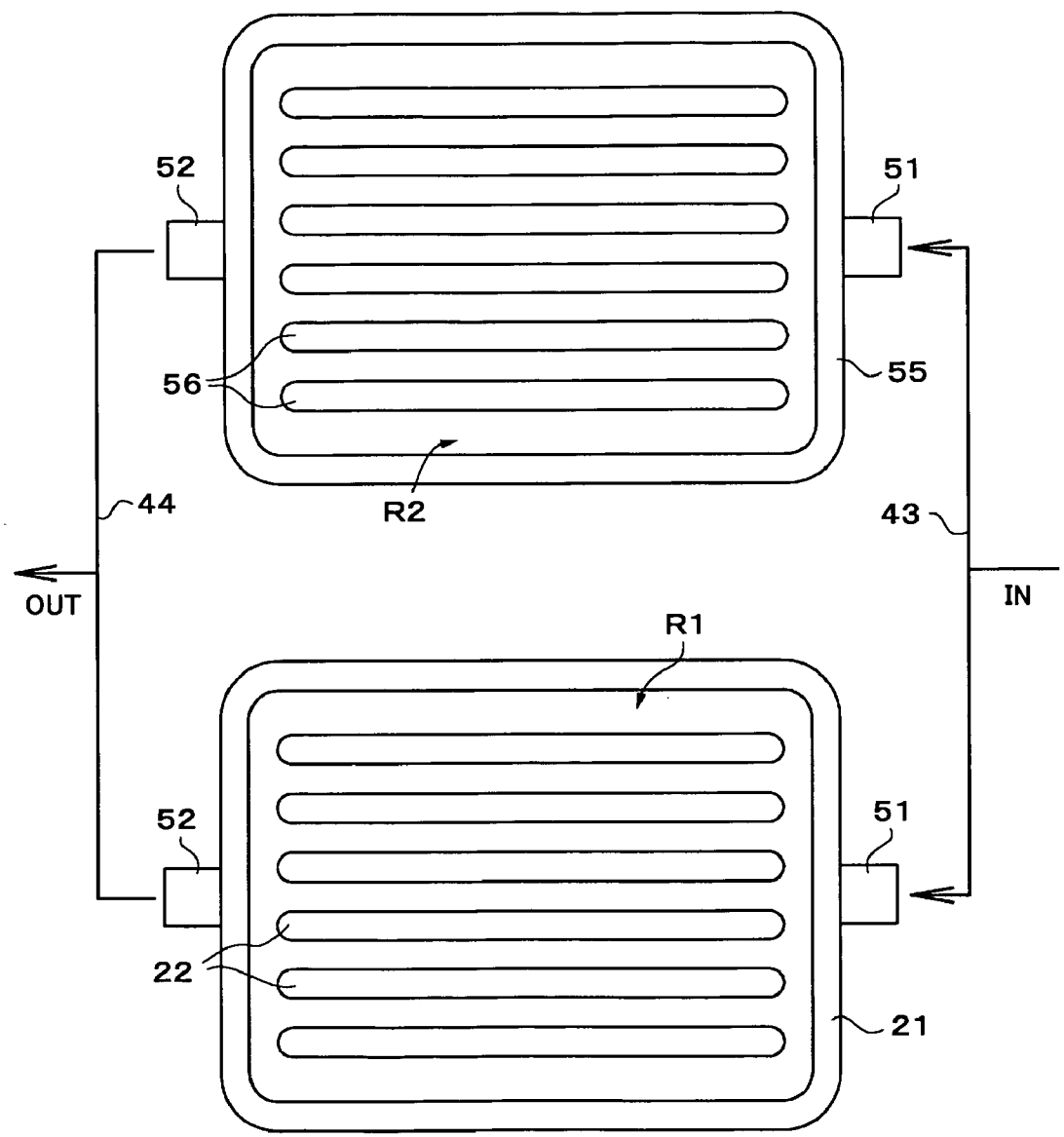
FIG. 6 is a schematic plan view showing a fin arrangement according to a third embodiment in the same representation as in FIG. 4.

Next, according to a third embodiment shown in FIG. 6, both heat-sink side fins 56 and drive-unit-casing side fins 22 comprise rib-shaped fins extending from a fluid inlet toward a fluid outlet and arranged in parallel at equal intervals, and the heat-sink side fins 56 and the drive-unit-casing side fins 22 are the same in number so as to cooperatively and substantially cross the space R with minute gaps therebetween. With such arrangement, pressure loss in the entire flow passage is greater than those in the preceding two embodiments, but the cooling efficiency is sharply enhanced since the heat exchanging area is increased.

Figure 7:
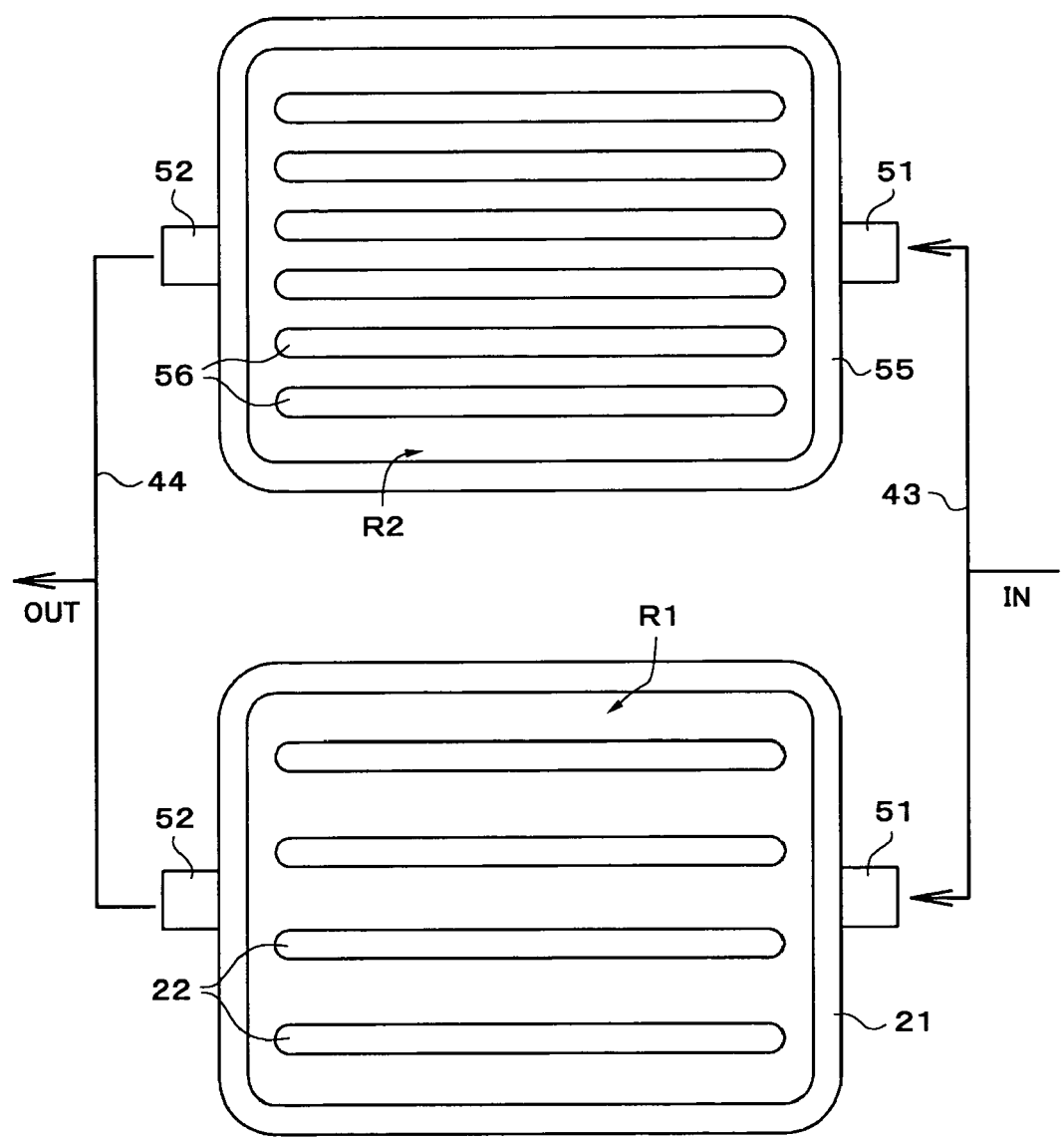
FIG. 7 is a schematic plan view showing a fin arrangement according to a fourth embodiment in the same representation as in FIG. 4.

Further, according to a fourth embodiment shown in FIG. 7, heat-sink side fins 56 and drive-unit-casing side fins 22 comprise the same rib-shaped fins and the both fins extend from a fluid inlet toward a fluid outlet and are arranged in parallel at equal intervals. In this embodiment, the drive-unit-casing side fins 22 are smaller in number than the heat-sink side fins 56. Like the relationship between the first embodiment and the second embodiment, with such arrangement, since the heat-sink side fins 56 have a large heat-exchanging area, cooling is intensely performed on the side of the heat sink 5, so that it is possible to generate, in the space, temperature gradient conformed to respective heat-resistant temperatures of the inverter 3 and the electric motor 1. Besides, in this embodiment, pressure loss in the entire space R can be also reduced corresponding to an extent, to which the drive-unit-casing side fins 22 are arranged to be sparse in density.

Figure 8:
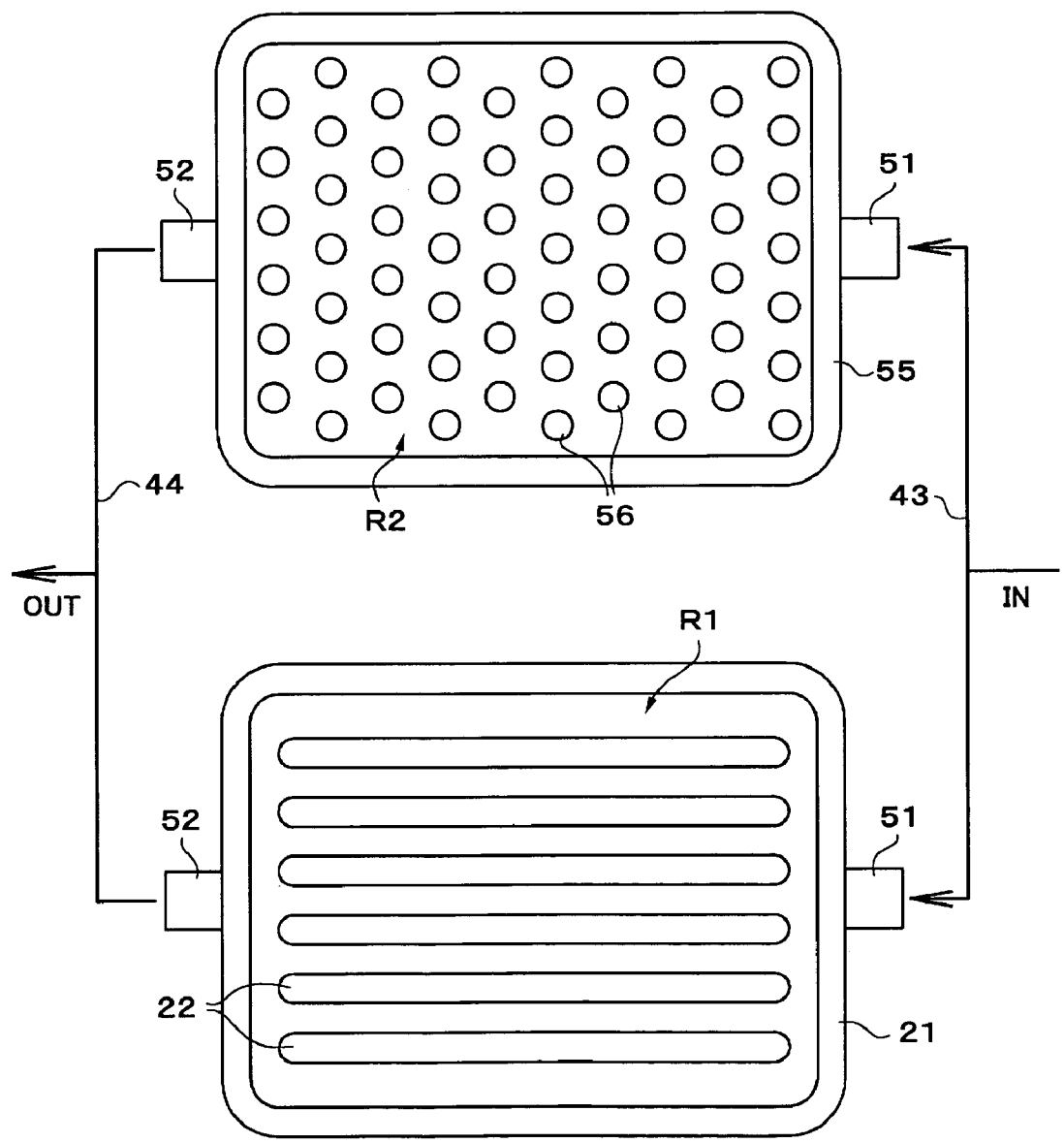
FIG. 8 is a schematic plan view showing a fin arrangement according to a fifth embodiment in the same representation as in FIG. 4.

Finally, according to a fifth embodiment shown in FIG. 8, heat-sink side fins 56 and drive-unit-casing side fins 22 are configured such that the drive-unit-casing side fins 22 comprise rib-shaped fins while the heat-sink side fins 56 comprise pin-shaped fins. In the case where one of the fins 22, 56 is rib-shaped and the other of them is pin-shaped in this manner, flow in the space on that side, in which the rib-shaped fins are arranged, is disadvantageous in terms of pressure loss but is advantageous in that the flow is forcedly guided in respective regions of the space to be made even. Flow in the space on that side, in which the pin-shaped fins are arranged, is advantageous in that pressure loss is decreased. Accordingly, with such arrangement of the fins, flow resistance in the flow passage within the space can be generally reduced as compared with the case where the fins in the both spaces comprise rib-shaped fins, and the flow characteristic can be made favorable as compared with the case where the fins in the both spaces comprise pin-shaped fins.

Figure 9:
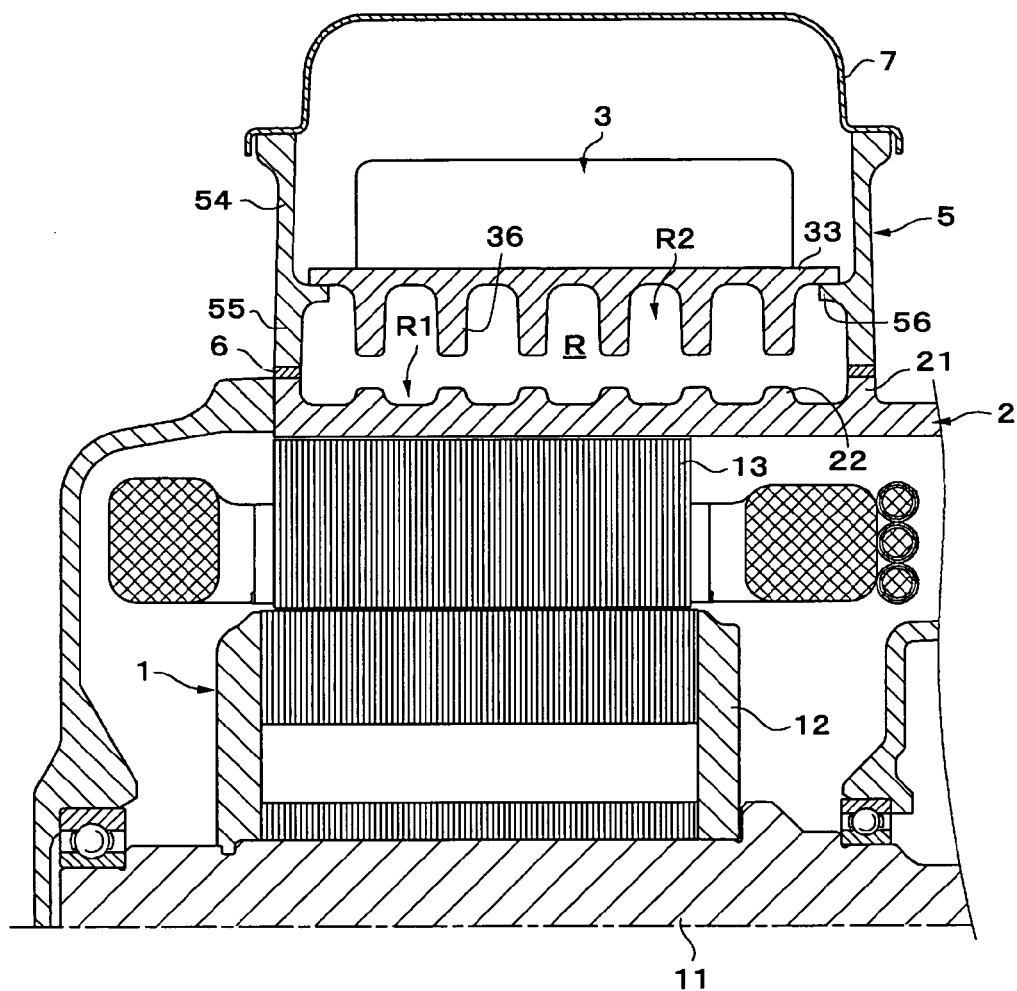
FIG. 9 is a view showing a longitudinal, cross section, in an axial direction, of a drive unit having a different configuration of a heat sink.

While the respective embodiments, in which the fins are modified in shape and arrangement, have been illustrated for the case where the module substrate that constitutes the inverter, and the heat sink are composed of separate members, similar shape and arrangement of fins can be also realized in the case where the inverter 3 itself is provided with a heat sink. Finally, a construction of a space defined assuming that a heat sink is composed of a module substrate is shown in a cross section, in an axial direction, of a drive unit shown in FIG. 9. This embodiment adopts a construction, in which an inverter casing 5 is frame-structured without any bottom wall, a periphery of a heat sink 33 is placed on a shelf-shaped portion 56 extending inward from a peripheral wall 55 of the inverter casing, appropriate sealing means (not shown) is interposed between the inverter casing and the heat sink to seal the portion as placed, and the inverter casing and the heat sink are fixed together by appropriate means. Even when such construction is adopted, fins 36 on the heat sink 33 side and fins 22 on the drive unit casing side can similarly be arranged to be apart from each other. In this embodiment, a space R is defined by a drive unit casing 2, the inverter casing 5, and the heat sink 33 of the inverter module. Since a remaining portion of the construction is the same as those in the respective embodiments previously illustrated, an explanation is replaced by the same reference numerals that denote corresponding members.

While the invention has been described above in detail on the basis of the six embodiments, it is not limited to such embodiments but can be embodied with its concrete construction modified variously within the scope described in the claims. For example, while the refrigerant exclusively composed of a cooling water is illustrated in the respective embodiments, it is of course possible to use other appropriate refrigerants.

INDUSTRIAL APPLICABILITY

The invention is widely applicable to apparatuses, in which an electric motor and an inverter are united together, as well as drive units for electric cars and hybrid drive units.

The invention claimed is:
1. A drive unit including
an electric motor,
a drive unit casing accommodating therein the electric motor,
an inverter that controls the electric motor, and
a flow passage of a refrigerant that cools the inverter,
wherein the inverter is mounted on the drive unit casing such that a heat sink united with a substrate of the inverter defines a space on a portion thereof opposed to the drive unit casing, and a thermally insulating intermediate member is interposed between mating surfaces of the heat sink and the drive unit casing,
the space is communicated to the flow passage of the refrigerant,
the heat sink comprises heat-sink side fins extending into the space toward the drive unit casing,
the drive unit casing comprises drive-unit-casing side fins extending into the space toward the heat sink,
the heat-sink side fins and the drive-unit-casing side fins are apart from each other, and
the heat-sink side fins and the drive-unit-casing side fins cooperatively generate a common refrigerant flow pattern within the space.

2. The drive unit according to claim 1 wherein one of the heat- sink side fins and the drive-unit-casing side fins comprises rib-shaped fins and the other of them comprises pin-shaped fins.

3. The drive unit according to claim 1, wherein the heat-sink side fins and the drive-unit-casing side fins cooperatively and substantially cross the space with a minute gap therebetween.

4. The drive unit according to claim 3 wherein the heat-sink side fins and the drive-unit-casing side fins comprise the same fins.

5. The drive unit according to claim 4, wherein both the heat-sink side fins and the drive-unit-casing side fins comprise pin-shaped fins.

6. The drive unit according to claim 3, wherein the heat-sink side fins and the drive-unit-casing side fins comprise the same fins.

7. The drive unit according to claim 1, wherein the heat-sink side fins and the drive-unit-casing side fins comprise the same fins.

8. The drive unit according to claim 7, wherein both the heat-sink side fins and the drive-unit-casing side fins comprise pin-shaped fins.

9. The drive unit according to claim 7, wherein the heat-sink side fins and the drive-unit-casing side fins cooperatively and substantially cross the space with a minute gap therebetween.

10. The drive unit according to claim 9, wherein both the heat-sink side fins and the drive-unit-casing side fins comprise pin-shaped fins.

11. The drive unit according to claim 1, wherein both the heat-sink side fins and the drive-unit-casing side fins comprise pin-shaped fins.

12. The drive unit according to claim 1, wherein the intermediate member forms a seal between the mating surfaces of the heat sink and the drive unit casing.

13. A drive unit including
an electric motor,
a drive unit casing accommodating therein the electric motor,
an inverter that controls the electric motor, and
a flow passage of a refrigerant that cools the inverter,
wherein the inverter is mounted on the drive unit casing such that a heat sink united with a substrate of the inverter defines a space on a portion thereof opposed to the drive unit casing, and a thermally insulating intermediate member is interposed only between mating surfaces of the heat sink and the drive unit casing, the space is communicated to the flow passage of the refrigerant, the heat sink comprises heat-sink side fins extending into the space toward the drive unit casing, the drive unit casing comprises drive-unit-casing side fins extending into the space toward the heat sink, and the heat-sink side fins and the drive-unit-casing side fins are apart from each other.

* * * * *